(12) United States Patent
Sakanishi

(10) Patent No.: US 11,542,406 B2
(45) Date of Patent: Jan. 3, 2023

(54) SURFACE PROTECTANT FOR SEMICONDUCTOR WAFER

(71) Applicant: DAICEL CORPORATION, Osaka (JP)

(72) Inventor: Yuichi Sakanishi, Tokyo (JP)

(73) Assignee: DAICEL CORPORATION, Osaka (JP)

(*) Notice: Subject to any disclaimer, the term of this patent is extended or adjusted under 35 U.S.C. 154(b) by 0 days.

(21) Appl. No.: 16/672,916

(22) Filed: Nov. 4, 2019

(65) Prior Publication Data

US 2020/0239727 A1    Jul. 30, 2020

(30) Foreign Application Priority Data

Jan. 30, 2019    (JP) ............................. JP2019-013877

(51) Int. Cl.

| | |
|---|---|
| *C09D 163/00* | (2006.01) |
| *H01L 21/306* | (2006.01) |
| *C08G 65/26* | (2006.01) |
| *C09D 5/08* | (2006.01) |
| *C09K 13/02* | (2006.01) |
| *H01L 21/302* | (2006.01) |
| *C09G 1/02* | (2006.01) |
| *H01L 21/02* | (2006.01) |

(52) U.S. Cl.
CPC ....... *C09D 163/00* (2013.01); *C08G 65/2609* (2013.01); *C09D 5/08* (2013.01); *C09G 1/02* (2013.01); *C09K 13/02* (2013.01); *H01L 21/302* (2013.01); *H01L 21/30625* (2013.01); *H01L 21/02013* (2013.01); *H01L 21/02024* (2013.01)

(58) Field of Classification Search
CPC ...... C09D 163/00; C09D 5/08; C09D 171/02; C09G 1/02; C09K 13/02; H01L 21/302; H01L 21/30625; H01L 21/02024; H01L 21/02013; H01L 21/306; C08G 65/2609
See application file for complete search history.

(56) References Cited

U.S. PATENT DOCUMENTS

| | | | | |
|---|---|---|---|---|
| 2,258,892 A * | 10/1941 | Harris | .................... | C07C 43/135 568/679 |
| 3,586,504 A * | 6/1971 | Coates | .................... | G03F 7/322 430/141 |
| 10,466,592 B2 | 11/2019 | Sakanishi | | |
| 10,844,334 B2 | 11/2020 | Sakanishi | | |
| 2010/0104884 A1 * | 4/2010 | Bloom | ................. | C09D 133/06 428/500 |
| 2016/0040041 A1 | 2/2016 | Minami et al. | | |
| 2018/0195030 A1 | 7/2018 | Sakanishi | | |
| 2018/0231890 A1 | 8/2018 | Sakanishi | | |

FOREIGN PATENT DOCUMENTS

| | | |
|---|---|---|
| CN | 108303862 A | 7/2018 |
| CN | 108415226 A | 8/2018 |
| JP | 2003-176479 A | 6/2003 |
| JP | 2009-99819 A | 5/2009 |
| JP | 2018-6538 A | 1/2018 |
| TW | 201831644 A | 9/2018 |
| WO | WO 2013/125441 A1 | 8/2013 |
| WO | WO 2014/034379 A1 | 3/2014 |

OTHER PUBLICATIONS

"Enzymatic Synthesis, Surface Activity, Antimicrobial Properties and Biodegradability of Di- and Triglycerol Fatty Acid Esters" J. Jpn. Oil Chem. Soc. vol. 48, No. 7 (1999), hereinafter referred to as "Matsumura" (Year: 1999).*

Matsumura et al. Enzymatic synthesis, surface activity, antimicrobial properties and biodegradability of Di and Triglycerol fatty acid esters, J. Jpn. Oil Chem Soc. vol. 48, No. 7. (1999) pp. 681-692) (Year: 1999).*

Office Action dated Oct. 25, 2022, in Japanese Patent Application No. 2019-013877.

* cited by examiner

*Primary Examiner* — Andrew J. Oyer
(74) *Attorney, Agent, or Firm* — Birch, Stewart, Kolasch & Birch, LLP

(57) ABSTRACT

Provided is a surface protectant that suppresses corrosion of a semiconductor wafer surface by a basic compound, and reduces defects in the semiconductor wafer.

The semiconductor wafer surface protectant of the present invention includes a compound represented by Formula (1) below;

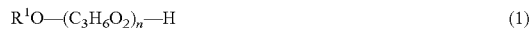

where $R^1$ denotes a hydrogen atom, a hydrocarbon group that has from 1 to 24 carbon atoms and may have a hydroxyl group, or a group represented by $R^2CO$, where the $R^2$ denotes a hydrocarbon group having from 1 to 24 carbon atoms; and n indicates an average degree of polymerization of a glycerin unit shown in the parentheses, and is from 2 to 60.

8 Claims, No Drawings

SURFACE PROTECTANT FOR SEMICONDUCTOR WAFER

TECHNICAL FIELD

The present invention relates to a surface protectant for semiconductor wafers. The present application claims priority to JP 2019-013877 filed in Japan on Jan. 30, 2019, the content of which is incorporated herein.

BACKGROUND ART

In recent years, semiconductor devices have been undergoing a trend of becoming more miniaturized and more highly integrated. Furthermore, a demand has arisen to achieve an even higher level of flatness of the surface of semiconductor wafers in order to stack, as designed, a wiring layer obtained by forming a circuit on the surface of the semiconductor wafer while preventing the stepped breakage of wiring or an increase in localized resistance values.

Chemical mechanical planarization (CMP) is widely used as a technique for flattening the semiconductor wafer surface. CMP is a technique in which a polishing composition containing a basic compound and fine abrasive grains is used to eliminate steps in the surface of semiconductor wafers through both a chemical action by the basic compound and a mechanical action by the abrasive grains.

In addition, the surface of a semiconductor wafer is typically polished by relatively moving the semiconductor wafer and a polishing pad in pressure contact therewith while supplying the polishing composition to the polishing pad surface. However, such a technique has the problems that the fine abrasive grains are easily agglomerated, and scratches (abrasions) are easily produced on the surface of the semiconductor wafer by the aggregates of abrasive grains.

As a means for solving these problems, Patent Document 1 describes that a polyoxyalkylene derivative, which is one type of surfactant, is added to the polishing composition. Patent Document 1 also describes that according to this method, agglomeration of the abrasive grains can be suppressed, the occurrence of scratches can be prevented, and the surface of the semiconductor wafer can be flattened on an advanced level.

CITATION LIST

Patent Document

Patent Document 1: JP 2003-176479 A

SUMMARY OF INVENTION

Technical Problem

Currently, quality requirements for semiconductor wafers are becoming more stringent in association with the further miniaturization and higher integration of semiconductor devices. Furthermore, in conjunction with the higher level of flatness, a reduction in defects is also being demanded. An example of a means for achieving a lower number of defects is a method of reducing the number of crystal originated particles (COP) that are generated inside crystals during crystal growth.

However, a problem associated with typical CMP is that the basic compound contained in the polishing composition penetrates into the COPs, and corrodes the peripheral portion thereof, and as a result, recess portions expand. Note that COPs are one type of crystal defect, and are cavity shaped defects in which a silicon atom is not present at the lattice point of a single crystal, that is, COPs are cavity shaped defects formed with a collection of "holes". Additionally, COPs have a negative effect on the pressure resistance of the gate oxide film.

Therefore, an object of the present invention is to provide a surface protectant that suppresses corrosion of a semiconductor wafer surface by a basic compound and reduces defects in the semiconductor wafer.

Another object of the present invention is to provide a surface protectant that suppresses corrosion of the semiconductor wafer surface by the basic compound, reduces defects in the semiconductor wafer, and further reduces the occurrence of scratches to thereby achieve a high level of flatness.

Another object of the present invention is to provide a method for manufacturing a semiconductor device, the method including polishing a semiconductor wafer using the surface protectant.

Solution to Problem

As a result of diligent research to solve the problems described above, the present inventors discovered that an expansion of a defective portion (such as a COP) of a semiconductor wafer due to the chemical action of CMP can be suppressed by covering an inner wall of the defective portion with a compound represented by Formula (1) below; the mechanical action of CMP is alleviated by covering the surface of the semiconductor wafer with the compound represented by Formula (1) below; aggregation of the abrasive grains is suppressed and the occurrence of scratches caused by aggregates of abrasive grains is reduced by using the compound represented by Formula (1) below; and these effects are combined to achieve a high level of flatness and a reduction in defects of the surface of the semiconductor wafer. The present invention has been completed based on these findings.

Namely, an embodiment of the present invention provides a semiconductor wafer surface protectant containing a compound represented by Formula (1) below;

$$R^1O—(C_3H_6O_2)_n—H \qquad (1)$$

where $R^1$ denotes a hydrogen atom, a hydrocarbon group that has from 1 to 24 carbon atoms and may have a hydroxyl group, or a group represented by $R^2CO$, where the $R^2$ denotes a hydrocarbon group having from 1 to 24 carbon atoms; and n indicates an average degree of polymerization of a glycerin unit shown in the parentheses, and is from 2 to 60.

The present invention also provides the semiconductor wafer surface protectant, wherein a molecular weight of the compound represented by Formula (1) is from 100 to 3000.

An embodiment of the present invention also provides the semiconductor wafer surface protectant, which is a silicon wafer surface protectant.

An embodiment of the present invention also provides the semiconductor wafer surface protectant, which is used for reducing defects in a semiconductor wafer surface.

An embodiment of the present invention also provides a method for manufacturing a semiconductor device, the method including polishing a semiconductor wafer surface under protection using the semiconductor wafer surface protectant.

Advantageous Effects of Invention

According to the semiconductor wafer surface protectant in an embodiment of the present invention, the compound represented by Formula (1) is adsorbed on the surface of the semiconductor wafer and forms into a hydrophilic protective layer on the surface of the semiconductor wafer, and thereby an expansion of defective portions due to the chemical action of CMP is suppressed, and the generation of scratches can be reduced by mitigating the mechanical action of CMP while suppressing the aggregation of abrasive grains. Therefore, in a case where CMP is performed, the semiconductor wafer surface can be flattened to a higher level with reduced defects by using the semiconductor wafer surface protectant according to an embodiment of the present invention.

Semiconductor wafers polished using the semiconductor wafer surface protectant according to an embodiment of the present invention have surfaces which are extremely flat, and small defective portions (or recesses). Therefore, high integration can be allowed while preventing stepped breakage of wiring or an increase in localized resistance values, and a highly integrated semiconductor device can be manufactured.

Thus, according to the semiconductor wafer surface protectant in an embodiment of the present invention, it is possible to miniaturize the electronic equipment and increase the functionality of the electronic equipment in which the semiconductor device is used.

DESCRIPTION OF EMBODIMENTS

Semiconductor Wafer Surface Protectant

The semiconductor wafer surface protectant according to an embodiment of the present invention is used when subjecting a semiconductor wafer to a surface flattening treatment or prior to subjecting the semiconductor wafer to a surface flattening treatment, and is a composition that contains a compound represented by Formula (1) below;

$$R^1O-(C_3H_6O_2)_n-H \quad (1)$$

where, $R^1$ denotes a hydrogen atom, a hydrocarbon group that has from 1 to 24 carbon atoms and may have a hydroxyl group, or a group represented by $R^2CO$, where the $R^2$ denotes a hydrocarbon group having from 1 to 24 carbon atoms; and n indicates the average degree of polymerization of a glycerin unit shown in the parentheses, and is from 2 to 60.

The $C_3H_6O_2$ in parentheses of Formula (1) may have a structure represented by Formula (2) and/or Formula (3) below.

$$-CH_2-CHOH-CH_2O- \quad (2)$$

$$-CH(CH_2OH)CH_2O- \quad (3)$$

The hydrocarbon groups for $R^1$ and $R^2$ include aliphatic hydrocarbon groups, alicyclic hydrocarbon groups, aromatic hydrocarbon groups, and groups in which two or more of these are bonded.

Examples of the aliphatic hydrocarbon groups include: linear or branched alkyl groups having from 1 to 24 (preferably from 5 to 20, and particularly preferably from 10 to 20) carbon atoms, such as a methyl group, an ethyl group, a propyl group, an isopropyl group, a butyl group, an isobutyl group, an s-butyl group, a t-butyl group, a pentyl group, a hexyl group, a decyl group, and a dodecyl group; linear or branched alkenyl groups having from 2 to 24 (preferably from 10 to 20) carbon atoms, such as a vinyl group, an allyl group, a 1-butenyl group, an oleyl group, and a linoleyl group; and linear or branched alkynyl groups having from 2 to 24 carbon atoms, such as an ethynyl group and a propynyl group.

Examples of the alicyclic hydrocarbon groups include: cycloalkyl groups of from 3 to 24 members (preferably from 3 to 15 members, and particularly preferably from 5 to 8 members) such as a cyclopropyl group, a cyclobutyl group, a cyclopentyl group, a cyclohexyl group, and a cyclooctyl group; cycloalkenyl groups of from 3 to 24 members (preferably from 3 to 15 members, and particularly preferably from 5 to 8 members) such as a cyclopentenyl group and a cyclohexenyl group; and bridged cyclic hydrocarbon groups such as a perhydronaphthalen-1-yl group, a norbornyl group, an adamantyl group, a tricyclo[5.2.1.0$^{2.6}$]decan-8-yl group, and a tetracyclo[4.4.0.1$^{2.5}$0.1$^{7.0}$]decan-3-yl group.

Examples of the aromatic hydrocarbon groups include aryl groups having from 6 to 24 (preferably from 6 to 15) carbon atoms, such as a phenyl group and a naphthyl group.

Examples of the hydrocarbon groups obtained by bonding an aliphatic hydrocarbon group and an alicyclic hydrocarbon group include cycloalkyl substituted alkyl groups (for example, $C_{3-20}$ cycloalkyl substituted $C_{1-4}$ alkyl groups), such as a cyclopentylmethyl group, a cyclohexylmethyl group, and a 2-cyclohexylethyl group. Furthermore, examples of the hydrocarbon groups obtained by bonding an aliphatic hydrocarbon group and an aromatic hydrocarbon group include: aralkyl groups (for example, $C_{7-18}$ aralkyl groups), and alkyl substituted aryl groups (for example, a phenyl group or naphthyl group substituted with approximately one to four $C_{1-4}$ alkyl groups).

Examples of the group represented by $R^2CO$ include aliphatic acyl groups such as acetyl, propionyl, butyryl, isobutyryl, stearoyl, and oleoyl groups; and aromatic acyl groups such as benzoyl, toluoyl, and naphthoyl groups.

Among the $R^1$, $R^1$ is particularly preferably an alkyl group (among which linear or branched alkyl groups such as a lauryl group, a stearyl group, and an isostearyl group are preferable) or a hydrogen atom.

In Formula (1), n indicates the average degree of polymerization of glycerin, and is from 2 to 60. Among these values, n is preferably from 2 to 30, and particularly preferably from 2 to 20 from the perspective of exhibiting excellent adsorption to the semiconductor wafer.

In addition, when $R^1$ in Formula (1) is an alkyl group (in particular, a linear or branched alkyl group such as a lauryl group, a stearyl group, and an isostearyl group), n is from 2 to 60, and from the perspective of excelling in adsorption to the semiconductor wafer, n is preferably from 2 to 30, particularly preferably from 2 to 20, most preferably from 2 to 15, and above all, most preferably from 4 to 10.

On the other hand, when $R^1$ in Formula (1) is a hydrogen atom, n is from 2 to 60, and from the perspective of excelling in adsorption to the semiconductor wafer, n is preferably from 2 to 30, particularly preferably from 10 to 30, most preferably from 10 to 25, and above all, most preferably from 10 to 20.

When the value of n falls outside the range described above, adsorption onto the semiconductor wafer tends to decline. Furthermore, when the value of n falls below the range described above, the hydrophilicity declines, and the effect of suppressing aggregation of the abrasive grains tends to be difficult to achieve.

The molecular weight of the compound represented by Formula (1) is, for example, from 100 to 3000, and from the perspective of excelling in adsorption by the semiconductor wafer, the molecular weight is preferably from 200 to 3000, more preferably from 200 to 2000, particularly preferably from 300 to 2000, and most preferably from 400 to 1500. Furthermore, from the perspective of excelling in adsorption by the semiconductor wafer and excelling in workability, the molecular weight of the compound thereof is more preferably from 400 to 1000, and most preferably from 400 to 800.

The compounds represented by Formula (1) in an embodiment of the present invention is, among others, preferably at least one compound selected from compounds represented by Formulas (1-1) to (1-7) below, and particularly preferably at least one compound selected from compounds represented by Formulas (1-1) to (1-4), (1-6), and (1-7) below.

$$C_{12}H_{25}O\text{—}(C_3H_6O_2)_4\text{—}H \quad (1\text{-}1)$$

$$C_{12}H_{25}O\text{—}(C_3H_6O_2)_{10}\text{—}H \quad (1\text{-}2)$$

$$C_{18}H_{37}\text{—}O\text{—}(C_3H_6O_2)_4\text{—}H \quad (1\text{-}3)$$

$$C_{18}H_{37}\text{—}O\text{—}(C_3H_6O_2)_{10}\text{—}H \quad (1\text{-}4)$$

$$CH_2\text{=}CH\text{—}CH_2\text{—}O\text{—}(C_3H_6O_2)_6\text{—}H \quad (1\text{-}5)$$

$$HO\text{—}(C_3H_6O_2)_{10}\text{—}H \quad (1\text{-}6)$$

$$HO\text{—}(C_3H_6O_2)_{20}\text{—}H \quad (1\text{-}7)$$

Examples of methods for producing a compound represented by Formula (1) in an embodiment of the present invention include: [1] a method of addition polymerization of 2,3-epoxy-1-propanol with a compound represented by $R^1OH$ ($R^1$ being the same as described above) in the presence of an alkali catalyst, [2] a method of reaction of a compound represented by $R^1X$ (where X denotes a halogen atom; and $R^1$ is the same as above, for example, an alkyl halide and an acid halide) with polyglycerin, and [3] a method of reaction of a glycidyl ether compound represented by Formula (4) below:

[Chem. 1]

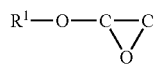

(4)

(where $R^1$ is the same as described above) with polyglycerin.

Examples of the alkali catalyst used in the method [1] described above include sodium hydroxide, potassium hydroxide, lithium hydroxide, metallic sodium, and sodium hydride. One type of the alkali catalyst alone or two or more types thereof in combination can be used.

Commercially available products such as those under trade names "Polyglycerin 04", "Polyglycerin 06", "Polyglycerin 10", and "Polyglycerin X" (available from Daicel Chemical Industries, Ltd.) can be suitably used as the polyglycerin used in the method [2] described above.

The semiconductor wafer surface protectant according to an embodiment of the present invention contains at least one compound represented by Formula (1) above. As described above, examples of the compound represented by Formula (1) above include polyglycerin, polyglycerol monoethers, and polyglycerol monoesters. Thus, the semiconductor wafer surface protectant according to an embodiment of the present invention contains at least one polyglycerin derivative selected from polyglycerin, polyglycerol monoethers, and polyglycerol monoesters.

As polyglycerin derivatives, besides the polyglycerin, polyglycerol monoethers, and polyglycerol monoesters, the semiconductor wafer surface protectant according to an embodiment of the present invention may also contain, for example, polyglycerol diether or polyglycerol diester corresponding to the compound represented by Formula (1). However, the total content of the polyglycerin, polyglycerol monoether and polyglycerol monoester is preferably not less than 75% of the total amount of the polyglycerin derivatives contained in the semiconductor wafer surface protectant according to an embodiment of the present invention because at such an amount, the surface protectant excels in adsorption to the semiconductor wafer, and exhibits an excellent effect of protecting the surface of the semiconductor wafer by adsorption thereon. The total content thereof is particularly preferably 90% or greater. Furthermore, the total content of polyglycerol diether and polyglycerol diester is preferably not greater than 5% of the total amount of polyglycerin derivatives contained in the semiconductor wafer surface protectant according to an embodiment of the present invention because at such an amount, the surface protectant excels in adsorption to the semiconductor wafer, and exhibits an excellent effect of protecting the surface of the semiconductor wafer by adsorption thereon. The total content thereof is particularly preferably not greater than 1%. The content percentage of each component contained in the polyglycerin derivatives is determined by separating each component through high performance liquid chromatography, calculating the peak area using a differential refractive index detector, and calculating the area ratio.

The semiconductor wafer surface protectant according to an embodiment of the present invention contains a compound represented by Formula (1) above as a nonvolatile component. The semiconductor wafer surface protectant according to an embodiment of the present invention may contain another component (for example, a water-soluble polymer compound such as a cellulose derivative) as a nonvolatile component, but the content percentage of the compound represented by Formula (1) relative to the total amount of the nonvolatile component included in the semiconductor wafer surface protectant according to an embodiment of the present invention (=percentage relative to the content of the compound represented by Formula (1)) is, for example, preferably 10 wt. % or greater from the perspective of excelling in adsorption to the semiconductor wafer and having an excellent effect of protecting the surface of the semiconductor wafer by adsorption thereon, and is more preferably 30 wt. % or greater, even more preferably 50 wt. % or greater, yet even more preferably 70 wt. % or greater, and particularly preferably 90 wt. % or greater. Note that the upper limit is 100 wt. %. That is, the semiconductor wafer surface protectant according to an embodiment of the present invention may contain substantially only the compound represented by Formula (1) as a nonvolatile component.

The semiconductor wafer surface protectant according to an embodiment of the present invention may contain a solvent together with the compound represented by Formula (1), and may be, for example, a composition in which the compound represented by Formula (1) is dissolved or dispersed in the solvent. Water is preferable as the solvent.

When the semiconductor wafer surface protectant according to an embodiment of the present invention is a composition containing the compound represented by Formula (1) and water, the content of the compound represented by Formula (1) is, for example, preferably in a range from 1 to 50 wt. % of the total amount of the composition from the perspective of achieving excellent handling properties with suitable viscosity, and is more preferably in a range from 3 to 40 wt. %, and particularly preferably in a range from 5 to 30 wt. %.

In the semiconductor wafer surface protectant according to an embodiment of the present invention, the compound represented by Formula (1) is adsorbed onto the surface of the semiconductor wafer with excellent adsorption force, and particularly with excellent adsorption force onto the surface of the semiconductor wafer from which the oxide film has been completely removed. Thus, in the surface treatment of the semiconductor wafer, the following three effects are obtained, and as a result, the semiconductor wafer surface can be flattened on a higher level with a lower number of defects.

1. The compound represented by Formula (1) can be adsorbed onto the inner wall of a defective portion (such as a COP) of the semiconductor wafer and form a surface protective layer covering the inner wall, thereby suppressing further expansion of the defective portion resulting from the chemical action of CMP.

2. The compound represented by Formula (1) is adsorbed on the surface of the semiconductor wafer and forms a hydrophilic surface protective layer covering the surface, and thereby the mechanical action of CMP (specifically, friction between the semiconductor wafer surface and the abrasive grains) is mitigated, and the occurrence of a low degree of unevenness such as scratches on the surface of the semiconductor wafer can be suppressed.

3. The compound represented by Formula (1) suppresses aggregation of the abrasive grains and improves the dispersibility of the abrasive grains, and thereby the mechanical action of CMP (specifically, friction between the semiconductor wafer surface and the abrasive grains) is mitigated, and the occurrence of a low degree of unevenness such as scratches on the surface of the semiconductor wafer can be suppressed.

The method of using the semiconductor wafer surface protectant according to an embodiment of the present invention is not particularly limited, and examples thereof include: a method in which prior to subjecting the semiconductor wafer to CMP, the semiconductor wafer surface protectant according to an embodiment of the present invention is applied to the semiconductor wafer to form a surface protective layer made from a compound represented by Formula (1) on the surface of the semiconductor wafer; and a method in which the semiconductor wafer surface protectant according to an embodiment of the present invention is added to a polishing composition that is used for implementing CMP, and the semiconductor wafer is subjected to CMP while forming a surface protective layer made from the compound represented by Formula (1), on the surface of the semiconductor wafer.

Polishing Composition

The polishing composition contains fine abrasive grains, a basic compound, and water. When the semiconductor wafer surface protectant according to an embodiment of the present invention is added to the polishing composition, the addition amount thereof is in such a range that the content of the compound represented by Formula (1) is, for example, approximately from 0.001 to 10 wt. % (preferably, from 0.005 to 5 wt. %) of the total amount of polishing composition.

The semiconductor wafer surface protectant according to an embodiment of the present invention does not induce agglomeration of the abrasive grains even when added to the polishing composition, and thus exhibits an effect of improving the dispersibility of the abrasive grains. This is because the compound represented by Formula (1) expresses a surfactant effect and suppresses aggregation of the abrasive grains. Therefore, when the semiconductor wafer surface protectant according to an embodiment of the present invention is added to the polishing composition, the dispersibility of the abrasive grains is improved, and thus the occurrence of scratching by the abrasive grains can be suppressed.

Colloidal silica is preferably used as the abrasive grains.

The content of the abrasive grains is, for example, approximately from 0.1 to 50 wt. %, preferably from 1 to 30 wt. %, and particularly preferably from 3 to 20 wt. % of the total amount of the polishing composition. The polishing composition containing the abrasive grains in the range described above retains the dispersibility of the abrasive grains in the polishing composition, and can suppress the occurrence of scratching. When such a polishing composition is used, a semiconductor wafer excelling in flatness can be produced through CMP in which the semiconductor wafer is polished at a favorable speed. When the content of the abrasive grains falls below the range described above, the polishing speed tends to become slower, and workability tends to decline. On the other hand, when the content of the abrasive grains exceeds the range described above, it tends to be difficult to maintain the dispersibility of the abrasive grains in the polishing composition, and use of such a polishing composition tends to cause scratching.

The average particle size of the abrasive grains can be selected, as appropriate, from the perspective of the polishing speed and flatness of the surface of the semiconductor wafer after polishing, and is, for example, from 2 to 500 nm, preferably from 5 to 300 nm, and particularly preferably from 5 to 200 nm.

A water soluble compound is preferably used as the basic compound. Examples of such basic compounds include alkali metal hydroxides, amines, ammonia, and ammonium hydroxide salts. One type of such a basic compound may be used alone, or two or more types thereof can be used in combination.

Examples of the alkali metal hydroxides include potassium hydroxide and sodium hydroxide. Examples of the amine include triethylamine, monoethanolamine, diethanolamine, triethanolamine, diisopropanolamine, ethylene diamine, hexamethylene diamine, diethylene triamine, triethyl pentamine, and tetraethyl pentamine. Examples of the ammonium hydroxide salt include tetramethylammonium hydroxide, tetraethyl ammonium hydroxide, and tetrabutylammonium hydroxide.

Among the above-mentioned basic compounds, ammonia and/or ammonium hydroxide salts are preferable from the perspective of less contamination to the semiconductor wafer.

The content of the basic compound is an amount such that the pH of the semiconductor wafer surface protectant according to an embodiment of the present invention is, for example, from 8 to 13 (preferably from 8.5 to 12, and particularly preferably from 9.0 to 11.0).

The content of water is more preferably an amount such that the viscosity of the polishing composition at 25° C. is, for example, from 0.1 to 10 mPa·s (preferably from 0.3 to 8 mPa·s, and particularly preferably from 0.5 to 5 mPa·s).

In addition to the components described above, the polishing composition may contain one or more of other components (for example, organic solvents, various chelating agents, and surfactants) as necessary.

EXAMPLES

Hereinafter, the present invention will be described more specifically with reference to examples; however, the present invention is not limited by these examples.

Example 1

4 mol of 2,3-epoxy-1-propanol (trade name "Glycidol", available from Daicel Corporation) was added to 1 mol of lauryl alcohol to obtain a compound (A1) ($C_{12}H_{25}O$—($C_3H_6O_2$)$_4$—H, molecular weight: 482).

The obtained compound (A1) was diluted with water such that the concentration thereof was 15 wt. %, to obtain a semiconductor wafer surface protectant (A1).

Example 2

A compound (A2) ($C_{12}H_{25}O$—($C_3H_6O_2$)$_{10}$—H, molecular weight: 926) was obtained in the same manner as in Example 1 with the exception that the amount of 2,3-epoxy-1-propanol used was changed to 10 mol.

The obtained compound (A2) was diluted with water such that the concentration thereof was 15 wt. %, to obtain a semiconductor wafer surface protectant (A2).

Example 3

A compound (A3) ($C_{12}H_{25}O$—($C_3H_6O_2$)$_6$—H, molecular weight: 630) was obtained in the same manner as in Example 1 with the exception that the amount of 2,3-epoxy-1-propanol used was changed to 6 mol.

The obtained compound (A3) was diluted with water such that the concentration thereof was 15 wt. %, to obtain a semiconductor wafer surface protectant (A3).

Example 4

10 mol of 2,3-epoxy-1-propanol (trade name "Glycidol", available from Daicel Corporation) was added to 1 mol of isostearyl alcohol, to obtain a compound (A4) ($C_{18}H_{37}O$—($C_3H_6O_2$)$_{10}$—H, molecular weight: 1010).

The obtained compound (A4) was diluted with water such that the concentration thereof was 15 wt. %, to obtain a semiconductor wafer surface protectant (A4).

Example 5

9 mol of 2,3-epoxy-1-propanol (trade name "Glycidol", available from Daicel Corporation) was added to 1 mol of glycerin, to obtain a compound (A5) (HO—($C_3H_6O_2$)$_{10}$—H, molecular weight: 758).

The obtained compound (A5) was diluted with water such that the concentration thereof was 15 wt. %, to obtain a semiconductor wafer surface protectant (A5).

Example 6

A compound (A6) (HO—($C_3H_6O_2$)$_{20}$—H, molecular weight: 1498) was obtained in the same manner as in Example 5 with the exception that the amount of 2,3-epoxy-1-propanol used was changed to 19 mol.

The obtained compound (A6) was diluted with water such that the concentration thereof was 15 wt. %, to obtain a semiconductor wafer surface protectant (A6).

Comparative Example 1

48 mol of ethylene oxide was added to 1 mol of ethylene glycol, after which 38 mol of propylene oxide was added thereto, to obtain a polyoxyalkylene derivative (B1) (molecular weight: 4378).

The obtained polyoxyalkylene derivative (B1) was diluted with water such that the concentration thereof was 15 wt. %, to obtain a semiconductor wafer surface protectant (B1).

Comparative Example 2

32 mol of ethylene oxide was added to 1 mol of ethylene glycol, after which 20 mol of propylene oxide was added thereto, to obtain a polyoxyalkylene derivative (B2) (molecular weight: 2630).

The obtained polyoxyalkylene derivative (B2) was diluted with water such that the concentration thereof was 15 wt. %, to obtain a semiconductor wafer surface protectant (B2).

Comparative Example 3

10 mol of ethylene oxide was added to 1 mol of lauryl alcohol, to obtain a polyoxyalkylene derivative (B3) (molecular weight: 626).

The obtained polyoxyalkylene derivative (B3) was diluted with water such that the concentration thereof was 15 wt. %, to obtain a semiconductor wafer surface protectant (B3).

Comparative Example 4

20 mol of ethylene oxide was added to 1 mol of lauryl alcohol, to obtain a polyoxyalkylene derivative (B4) (molecular weight: 1066).

The obtained polyoxyalkylene derivative (B4) was diluted with water such that the concentration thereof was 15 wt. %, to obtain a semiconductor wafer surface protectant (B4).

The following evaluations were performed on the semiconductor wafer surface protectants obtained in the Examples and Comparative Examples.

Corrosion Resistance Test
Preparation of Sample

A silicon wafer was immersed in a 3% aqueous hydrofluoric acid solution for 20 seconds to remove the oxide film from the surface of the silicon wafer, and then washed with pure water for 10 seconds. This operation was repeated until the surface of the silicon wafer was completely water repellent. A silicon wafer of which the oxide film was removed in this manner was used as a sample.

Preparation of Solution for Corrosion Resistance Test

Next, each of the semiconductor wafer surface protectants obtained in the Examples and Comparative Examples was added to ammonia water having a weight ratio of ammonia:water of 1:19 such that the concentration of the nonvolatile component, selected from the compounds (A1) to (A6) and the polyoxyalkylene derivatives (B1) to (B4), in the semiconductor wafer surface protectant was 0.18 wt. %, to prepare respective test solutions A.

The above-mentioned sample was completely immersed in each of the test solutions A and allowed to sit at 25° C. for 12 hours. The corrosion resistance was then evaluated from the corrosion rate as calculated by the following equation. Note that a slower corrosion rate indicates a better corrosion resistance.

$$\text{Corrosion Rate (nm/min)} = \frac{\left[\begin{array}{c}\text{Sample weight before immersion (g)} - \\ \text{Sample weight after immersion (g)}\end{array}\right] \times \text{Sample thickness (cm)} \times 10^7}{\text{Sample weight before immersion (g)} \times \text{Sample immersion time (min)}} \quad \text{[Equation 1]}$$

Furthermore, the surface of the sample removed from the test solution A was visually confirmed, and corrosion resistance was evaluated according to the following criteria.

Evaluation Criteria

Excellent Corrosion Resistance (Excellent): No roughness was observed on the surface.

Good Corrosion Resistance (Good): Surface was slightly rough.

Poor Corrosion Resistance (Poor): Surface was obviously rough.

Adsorption Test

Preparation of Solution for Adsorption Test

Each of the semiconductor wafer surface protectants obtained in the Examples and Comparative Examples was dissolved in water, to prepare respective test solutions B having a concentration of 0.18 wt. %.

A sample prepared in the same manner as the sample preparation for the Corrosion Resistance Test described above was immersed in the respective test solutions B for 5 minutes at 40° C. Next, using tweezers, the sample was pulled out from the test solution B so that the surface of the sample was perpendicular to the surface of the solution, and after 10 seconds, the water repellency distance from the sample end was measured, and the adsorption, to the sample, of each of semiconductor wafer surface protectants obtained in the Examples and Comparative Examples was evaluated based on the following criteria. Note that when the semiconductor wafer surface protectants obtained in the Examples and Comparative Examples were adsorbed well onto the surface of the sample and covered the surface of the sample, the surface of the sample became hydrophilic, and the water repellency distance was reduced.

Evaluation Criteria

Excellent Adsorption (Excellent): Water repellency distance of less than 5 mm

Good Adsorption (Good): Water repellency distance of from 5 to 10 mm Poor Adsorption (Poor): Water repellency distance of greater than 10 mm Test for Abrasive Grain Dispersibility 0.5 g of an aqueous solution of the respective semiconductor wafer surface protectants obtained in the Examples and Comparative Examples (concentration of the nonvolatile component, selected from the compounds (A1) to (A6) and the polyoxyalkylene derivatives (B1) to (B4), in the semiconductor wafer surface protectants: 20%) was added to 5.0 g of a colloidal silica dispersion (I) (primary particle size: 30 to 50 nm, concentration of silica solid content: 10%) that is adjusted to a pH of 10.0 by adding ammonia water, and the mixture was thoroughly mixed to obtain respective colloidal silica dispersions (II).

A particle size [D1] of the silica in the colloidal silica dispersion (I) and a particle size [D2] of the silica in the colloidal silica dispersion (II) were measured by dynamic light scattering (ELSZ-1000, available from Otsuka Electronics Co., Ltd.).

The rate of change of the particle size was calculated using the following equation, and determined according to the following criteria.

Rate of Change (%)={(D2−D1)/D1}×100

Evaluation Criteria

Excellent Dispersibility (Excellent): Rate of change of less than 10%

Good Dispersibility (Good): Rate of change of from 10% to less than 30%

Poor Dispersibility (Poor): Rate of change of 30% or greater

TABLE 1

| | | Corrosion Resistance | | | |
|---|---|---|---|---|---|
| | Surface Protectant | Corrosion Rate (nm/min) | Wafer Appearance | Adsorption | Dispersibility of Abrasive Grains |
| Example 1 | A1 | 0.2 | Excellent | Excellent | Excellent |
| Example 2 | A2 | 0.2 | Excellent | Excellent | Excellent |
| Example 3 | A3 | 0.1 | Excellent | Excellent | Excellent |
| Example 4 | A4 | 0.2 | Excellent | Excellent | Excellent |
| Example 5 | A5 | 0.1 | Excellent | Excellent | Excellent |
| Example 6 | A6 | 0.1 | Excellent | Excellent | Excellent |
| Comparative Example 1 | B1 | 1.2 | Good | Excellent | Excellent |
| Comparative Example 2 | B2 | 1.1 | Poor | Excellent | Excellent |
| Comparative Example 3 | B3 | 2.3 | Poor | Poor | Poor |
| Comparative Example 4 | B4 | 1.8 | Poor | Good | Good |

INDUSTRIAL APPLICABILITY

According to the semiconductor wafer surface protectant of the present invention, an expansion of defective portions due to the chemical action of CMP is suppressed, and the generation of scratches can be reduced by mitigating the mechanical action of CMP while suppressing the aggregation of abrasive grains. Therefore, when the semiconductor wafer surface protectant of the present invention is used, the semiconductor wafer surface can be flattened to a higher level with reduced defects, without implementing CMP.

The invention claimed is:

1. A semiconductor wafer surface protectant comprising a compound represented by Formula (1);

$$R^1O\text{—}(C_3H_6O_2)_n\text{—}H \quad (1)$$

wherein $R^1$ denotes a hydrocarbon group that has from 1 to 24 carbon atoms and optionally has a hydroxyl group;

wherein n indicates an average degree of polymerization of a glycerin unit shown in the parentheses, and is from 4 to 60; and wherein a content of the compound represented by Formula (1) is 90 wt. % or more of a total amount of a nonvolatile component in the semiconductor wafer surface protectant.

2. The semiconductor wafer surface protectant according to claim 1, wherein a molecular weight of the compound represented by Formula (1) is from 300 to 3000.

3. A method for manufacturing the semiconductor wafer surface protectant of according to claim 1; said method comprising:

diluting the compound of Formula (1) with water to obtain said semiconductor wafer surface protectant having said content of 90 wt. % or more of the compound represented by Formula (1) relative to the total amount of the nonvolatile component in the semiconductor wafer surface protectant.

4. The method for manufacturing a semiconductor wafer surface protectant according to claim 3, wherein a molecular weight of the compound represented by Formula (1) is from 300 to 3000.

5. The method for manufacturing a semiconductor wafer surface protectant according to claim 3, wherein the semiconductor wafer is a silicon wafer.

6. A method for reducing defects in a semiconductor wafer surface, the method comprising:
  applying the semiconductor wafer surface protectant according to claim 1 onto the surface of a semiconductor wafer, where said compound is adsorbed onto a defective portion of said surface of the semiconductor wafer.

7. A method for manufacturing a semiconductor device, the method comprising polishing a semiconductor wafer surface by coating the semiconductor wafer surface protectant according to of claim 1.

8. A polishing composition comprising:
  the semiconductor wafer surface protectant according to of claim 1, abrasive grains, and a basic compound.

* * * * *